(12) United States Patent
Ichikawa et al.

(10) Patent No.: US 8,017,876 B2
(45) Date of Patent: Sep. 13, 2011

(54) TERMINAL PORTION OF FLEXIBLE PRINT CIRCUIT BOARD OR FLEXIBLE FLAT CABLE

(75) Inventors: Masateru Ichikawa, Toda (JP); Kunihiro Naoe, Tokyo (JP); Shoji Ajimura, Oiso-machi (JP)

(73) Assignee: Fujikura Ltd., Tokyo (JP)

( * ) Notice: Subject to any disclaimer, the term of this patent is extended or adjusted under 35 U.S.C. 154(b) by 924 days.

(21) Appl. No.: 11/571,821

(22) PCT Filed: Jul. 8, 2005

(86) PCT No.: PCT/JP2005/012681
§ 371 (c)(1),
(2), (4) Date: Mar. 21, 2007

(87) PCT Pub. No.: WO2006/006534
PCT Pub. Date: Jan. 19, 2006

(65) Prior Publication Data
US 2007/0256856 A1      Nov. 8, 2007

(30) Foreign Application Priority Data

Jul. 8, 2004 (JP) ................................. 2004-201988
Apr. 19, 2005 (JP) ................................. 2005-120784

(51) Int. Cl.
*H01R 12/04* (2006.01)
*H05K 1/11* (2006.01)

(52) U.S. Cl. .......................................... 174/267; 29/842
(58) Field of Classification Search .................. 174/267; 29/842–845
See application file for complete search history.

(56) References Cited

U.S. PATENT DOCUMENTS

| 2,742,687 A | 4/1956 | Ruemmler |
| 4,093,466 A | 6/1978 | Davis |
| 4,263,106 A | 4/1981 | Kohl |
| 4,331,518 A | 5/1982 | Wilson |

(Continued)

FOREIGN PATENT DOCUMENTS

EP    1026287 A1    8/2000

(Continued)

OTHER PUBLICATIONS

Machine translation of JP 11-111422 (Aug. 10, 1997); Sumitomo electric Ind. Ltd.*

(Continued)

*Primary Examiner* — Jeremy Norris
(74) *Attorney, Agent, or Firm* — Sughrue Mion, PLLC

(57) ABSTRACT

In a terminal portion having a copper or a copper alloy wiring according to one embodiment, the terminal portion being of a flexible print circuit board or a flexible flat cable and for connecter-fitting to a connector by being pressed by a connector pin, the copper or the copper alloy wiring having a pure tin or a lead-free tin alloy plating layer formed thereon is thermally treated so as to form an inter-metal compound including copper and tin on the copper or the copper alloy wiring, and a remaining thickness of the pure tin or the lead-free tin alloy plating layer is from 0.2 μm to 1.6 μm, wherein as an initial plating layer, a thickness of the pure tin or the lead-free tin alloy plating layer formed on the copper or the copper alloy wiring is from 1.5 μm to 5.0 μm, and a thickness of the inter-metal compound including copper and tin is from 0.1 μm to 3.5 μm.

5 Claims, 1 Drawing Sheet

U.S. PATENT DOCUMENTS

| | | | |
|---|---|---|---|
| 4,749,626 A | 6/1988 | Kadija et al. | |
| 6,040,067 A | 3/2000 | Sugawara et al. | |
| 6,312,762 B1 | 11/2001 | Sugawara et al. | |
| 7,491,897 B2 * | 2/2009 | Watanabe et al. | 174/266 |

FOREIGN PATENT DOCUMENTS

| | | | |
|---|---|---|---|
| EP | 1784064 A1 | 5/2007 |
| JP | 03-014814 A | 1/1991 |
| JP | 05-033187 A | 2/1993 |
| JP | 10-050774 A | 2/1998 |
| JP | 10-302867 A | 11/1998 |
| JP | 11-111422 A | 4/1999 |
| JP | 11-135226 A | 5/1999 |
| JP | 11-189894 A | 7/1999 |
| JP | 11-343594 A | 12/1999 |
| JP | 2001-026898 A | 1/2001 |
| JP | 2001-144145 A | 5/2001 |
| JP | 2002-069688 A | 3/2002 |
| JP | 2002-080993 A | 3/2002 |
| JP | 2002-226982 A | 8/2002 |
| JP | 2005243345 A | 9/2005 |
| JP | 2006127939 A | 5/2006 |
| JP | 2006319269 A | 11/2006 |
| WO | 2006006534 A1 | 1/2006 |
| WO | 2006062126 A1 | 6/2006 |

OTHER PUBLICATIONS

European Office Action dated Nov. 4, 2010 from corresponding application.

S.M. Arnold, "Repressing the Growth of Tin Whiskers," Plating, Jan. 1966, pp. 96-99.

English Translation of Chinese Patent Office Action dated Sep. 13, 2010.

Korean Patent Office Action dated Oct. 20, 2010 and English-language translation of a Japanese-language translation thereof.

S.C. Britton, "Spontaneous Growth of Whiskers on Tin Coatings: 20 Years of Observation," Transactions of the Institute of Metal Finishing, 1974, pp. 95-102, vol. 52.

United States Patent and Trademark Office, "Non-Final Office Action," issued in connection with U.S. Appl. No. 12/409,350, on Aug. 23, 2010.

United States Patent and Trademark Office, "Non-Final Office Action," issued in connection with U.S. Appl. No. 12/409,350, on Dec. 14, 2010.

* cited by examiner

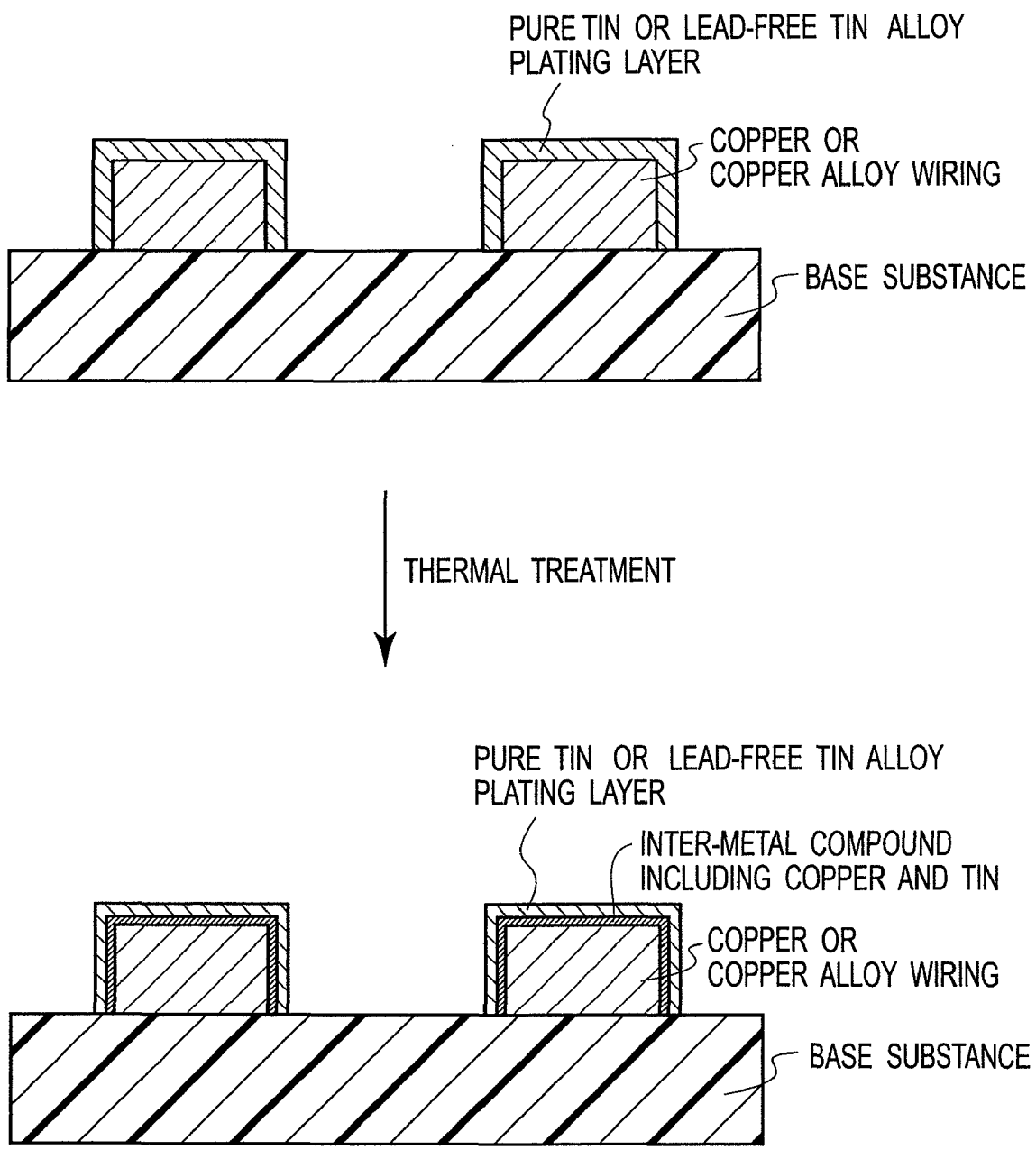

TERMINAL PORTION OF FLEXIBLE PRINT CIRCUIT BOARD OR FLEXIBLE FLAT CABLE

This application claims priority from PCT Application No. PCT/JP2005/012681 filed Jul. 8, 2005, and from Japanese Patent Application Nos. 2004-201988 and 2005-120784 filed Jul. 8, 2004 and Apr. 19, 2005, respectively, which applications are incorporated herein by reference.

TECHNICAL FIELD

The present invention relates to a terminal portion of a flexible print circuit board and flexible flat cable that are almost free from whisker development, excellent in a contact resistance, and almost free from pin-hole formation.

BACKGROUND ART

Many flexible print circuit boards (hereinafter, FPC) and flexible flat cables (hereinafter, FFC) for use in an electric appliance or the like use copper or copper alloy for their wiring. When they are electrically connected with other circuit boards or the like, there have been employed connector connection in many cases. In such a connection, in order to reduce a connection resistance of the connector with the wiring thus to avoid conduction faults, a surface-treatment is carried out for a copper wiring terminal. An example thereof includes an electrolytic plating treatment with gold, tin-lead alloy, or the like. However, gold plating is accompanied by a problem of high costs. In addition, plating with lead-containing alloys has a problem of environmental destruction through elution of lead therefrom, which motivates a practical use of lead-free plating. To this end, there has been investigated a plating treatment with pure tin or lead-free tin alloys. However, when a copper wiring terminal plated with lead-free tin alloys or pure tin is fitted with a connector, it is confirmed that a whisker-like crystal, simply called whisker, rapidly develops from a contact portion therebetween, since a connecter pin is pressed on the wiring terminal portion. It has also been revealed that such phenomenon is significant in pure tin plating or lead-free tin alloy plating. According to further experiments, it has been confirmed that the phenomenon occurs when pressure greater than a certain magnitude is applied even after a plated film is plastically deformed. Growth of such whiskers is undesirable since there is caused a short-circuit between copper wirings or somewhere, leading to a trouble in electric appliances or the like.

A technique for solving a whisker problem is disclosed in a Japanese Patent Application Laid-open Publication No. H11-343594. Namely, this publication discloses a configuration in which a CuSn containing layer or a CuSn containing alloy layer is formed above a base substance having at least a surface of Cu or Cu alloy with an intermediate layer therebetween, the intermediate layer being composed of $Cu_6Sn_5$ ($\eta'$ phase) and $Cu_3Sn$ ($\epsilon$ phase) laminated in this order. These layers each contain 0.1 to 3 wt % of Cu and have a thickness of 1 to 20 $\mu m$. These layers are made by plating the base substance having at least a surface of Cu or Cu alloy in an Sn plating bath or an Sn alloy plating bath containing Cu ions of 0.2 to 50 ppm. In addition, the publication describes that whisker development can be almost prevented by reflow treatment. However, it has been revealed that the reflow treatment alone has a prevention effect for naturally developing whiskers but not a sufficient effect for whiskers developed as result of fitting the connector.

Japanese Patent Publication No. 3014814 discloses a method of preventing tin plating whisker that may cause a short-circuit in a minute pattern of copper or copper alloy wiring electro-plated with tin. Specifically, in the method, first of all, a pure tin layer having a thickness of 0.1 $\mu m$ or more is formed on a minute pattern of copper or its alloy by plating; next, the pure tin layer is entirely turned into a Cu—Sn diffusion layer by thermal treatment; and last a pure tin plating layer having a thickness of 0.15 to 0.8 $\mu m$ is formed thereon. This prevents development of tin plating whiskers. However, since the tin plating is conducted twice in this method, there is caused a problem of complicated procedures, production costs or the like. Therefore, there has been desired a technique for solving these problems.

DISCLOSURE OF INVENTION

An objective of the present invention is to provide a flexible print circuit board terminal and a flexible flat cable terminal which include a pure tin plating layer or a lead-free tin alloy layer, the terminals being almost free from whisker development and excellent in a contact resistance. Another objective of the present invention is to provide a practicable flexible print circuit board terminal and flexible flat cable terminal which are almost free from whisker development, which are excellent in a contact resistance, which are free from pin holes, and which are excellent in glossiness.

In order to accomplish the above objective, a first aspect of the present invention provides a terminal portion having a copper or a copper alloy wiring, to be connect-fitted to a connector by being pressed by a connector pin, of a flexible print circuit board or a flexible flat cable, wherein the copper or the copper alloy wiring having a pure tin or a lead-free tin alloy plating layer formed thereon is thermally treated so as to form an inter-metal compound including copper and tin on the copper or the copper alloy wiring, and a remaining thickness of the pure tin or the lead-free tin alloy plating layer is from 0.2 $\mu m$ to 1.6 $\mu m$, wherein as an initial plating layer, a thickness of the pure tin or the lead-free tin alloy plating layer formed on the copper or the copper alloy wiring is from 1.5 $\mu m$ to 5.0 $\mu m$, and a thickness of the inter-metal compound including copper and tin is from 0.1 $\mu m$ to 3.5 $\mu m$.

A second aspect of the present invention provides a terminal portion of a flexible print circuit board or a flexible flat cable according to the first aspect, wherein the remaining thickness of the pure tin or the lead-free tin alloy plating layer is 0.2 $\mu m$ or more and less than 1.0 $\mu m$.

A third aspect of the present invention provides a terminal portion of a flexible print circuit board or a flexible flat cable according to the first aspect or the second aspect, wherein the thickness of the initial plating layer of the pure tin or the lead-free tin alloy formed on the copper or the copper alloy wiring is a thickness obtained from an existing amount of tin in the remaining plating layer and the inter-metal compound diffusion layer.

A fourth aspect of the present invention provides a terminal portion of a flexible print circuit board or a flexible flat cable according to the first aspect or the second aspect, wherein the lead-free tin alloy plating layer is selected from tin-copper alloy, tin-silver alloy, and tin-bismuth alloy.

A fifth aspect of the present invention provides a terminal portion of a flexible print circuit board or a flexible flat cable according to the first aspect or the second aspect, wherein the initial plating layer of the pure tin or the lead-free tin alloy formed on the copper or the copper alloy wiring is formed through one plating operation.

According to each of the afore-mentioned aspect of the present invention, since the copper or the copper alloy wiring on which the pure tin or the tin alloy plating layer is formed is thermally treated so that the inter-metal compound diffusion layer containing copper and tin is formed and the remaining thickness of the pure tin or the tin alloy plating layer is from 0.2 to 1.6 μm, whiskers are small and incur no practical problem even if they develop.

More preferably, when the remaining thickness of the pure tin or the tin alloy plating layer is 0.2 or more and less than 1.0 μm, whiskers are further prevented from developing. Specifically, even if whiskers develop, the maximum length thereof can be 30 μm or less, thereby causing no short-circuit trouble when a connector is fitted thereto. In addition, more preferably, a contact resistance of the terminal portion is less than 50 mΩ. It is not to be argued that no environmental problem due to lead is caused.

Moreover, since the initial thickness of the tin or the tin alloy plating layer formed on the copper or the copper alloy wiring is 0.5 μm or more, pin holes are prevented from causing, in addition to the afore-mentioned advantage, thereby ensuring that the underlying copper or the copper alloy wiring is plated and thereby causing no practical problem in terms of glossiness. Furthermore, since the thickness of the initial plating layer is 0.5 μm or more, this thickness being determined from an tin amount existing in the remaining tin plating layer and the inter-metal compound diffusion layer, the initial thickness of the plating layer in a produce can be known even when it is impossible to measure a thickness of the plating layer right after plating.

Furthermore, since the tin alloy plating layer is selected from tin-copper alloy, tin-silver alloy, and tin-bismuth alloy, various lead-free tin alloys are chosen and the FPC or the FFC terminal portion having the aforementioned characteristics can be provided.

By the way, in the FPC or the FFC terminal portion according to the present invention, since the initial plating layer of pure tin or tin alloy is formed by one plating operation, it is only through a simple production process that the FPC or the FFC terminal portion having the aforementioned characteristics can be obtained, thereby enabling a reduction in production costs.

BRIEF DESCRIPTION OF THE DRAWINGS

The above and other aspects of illustrative embodiments will become more apparent by describing illustrative embodiments in detail with reference to the attached drawing, in which:

FIG. 1 shows an illustrative embodiment of a terminal portion.

BEST MODE FOR CARRYING OUT THE INVENTION

Referring to accompanying drawings, embodiments of the present invention will be described hereinafter.

A First Embodiment

In a terminal portion to which an FPC or an FFC connecter is fitted, according to a first embodiment of the present invention, a copper or a copper alloy wiring on which a pure tin or a tin alloy plating layer is formed is thermally treated and thus a inter-metal compound diffusion layer containing copper and tin on the copper or the copper alloy wiring. The pure tin or the tin alloy plating layer remains to 0.2 to 1.6 μm thick.

The inventors of the present invention have investigated whisker development when an FPC or an FFC terminal portion is fitted to a connector, especially a connector having a pin. As a result, they have found a fact that the whisker development is influenced greatly by external stress and made the present invention based on the fact. According to the instant invention, the external stress applied on the plating layer becomes less influential by adjusting through thermal treatment a thickness relation between the pure tin or tin alloy plating layer and the inter-metal compound diffusion layer containing copper and tin, thereby preventing the whisker development.

Namely, the inter-metal compound diffusion layer containing copper and tin is formed on the copper or the copper alloy wiring by thermally treating the copper or the copper alloy wiring on which the pure tin or the tin alloy plating layer is formed. In addition, the thermal treatment is carried out so that the remaining thickness of the pure tin or the tin alloy plating layer becomes 0.2 to 1.6 μm. Because of this, whiskers are prevented from developing even when the connecter is fitted thereon. Or, if the whiskers develop, the maximum length thereof is limited to 50 μm or less. Therefore, there is prevented a short-circuit that may be caused by fitting the connectors.

By the way, when the remaining thickness of the pure tin or the tin alloy plating layer is less than 0.2 μm after thermal treatment, a contact resistance is increased so that a sufficient conduction is not assured when the terminal portion is connected to the connecter. In addition, when the remaining thickness exceeds 1.6 μm, a frequency of development (development rate or length) is increased and the maximum length may exceeds 50 μm when the terminal portion is connected to the connector. On the other hand, it has been confirmed that the maximum length of whiskers is 50 μm or less when the remaining thickness of the plating layer is 1 to 1.6 μm. When the remaining thickness of the pure tin or the tin alloy plating layer is 0.2 to 1.6 μm, the inter-metal compound diffusion layer composed of copper and tin has a thickness of about 0.1 to 3.5 μm. Such a terminal portion has a low contact resistance of less than 50 mΩ and provides no problem of environmental destruction due to lead.

A Second Embodiment

In an FPC or an FFC terminal portion according to a second embodiment, the remaining thickness of the pure tin or the tin alloy plating layer is 0.2 μm or more and less than 1.0 μm. By this way, whisker development is further prevented by limiting the remaining thickness of the pure tin or the tin alloy plating layer to less than 1.0 μm. In addition, even when whiskers develop, their maximum length is less than 30 μm. Therefore, short-circuit troubles do not take place when the terminal portion is connected to the connector. Moreover, the FPC or the FFC terminal portion has a low contact resistance of 50 mΩ and is excellent in electrical properties. Furthermore, since the plating is lead-free, there is caused no environmental problem due to lead.

A Third Embodiment

In an FPC or an FFC terminal portion according to a third embodiment, a thickness of an initial plating layer of pure tin or tin alloy formed on a copper or a copper alloy wiring is made 0.5 μm or more, in order to prevent pin-hole formation as well. Specifically, the plating layer of pure tin or tin alloy to be formed on the copper or the copper alloy wiring is formed by electrolytic-plating so that the plating layer has an initial thickness of 0.5 μm or more. Then, the inter-metal compound diffusion layer composed of copper and tin as well as the pure tin or the tin alloy plating layer is formed by thermal treatment. There can be provided an FPC or an FFC terminal portion in which the maximum length of whiskers is 50 μm or less, or 30 μm or less by treating so that the remaining thickness of the plating layer after thermal treatment is from 0.2 to 1.6 μm, preferably 0.2 μm or more and less than 1.0 μm. When a thickness of the initial plating layer of pure tin or tin alloy is less than 0.5 μm, there are caused defects such as pin-holes when electrolytic-plating, which is unfavorable because such defects may cause erosion for a long period of time in use. By the way, the pure tin or the tin alloy plating layer formed initially on the copper or copper alloy wiring is preferably from 4 to 5 μm thick. This is because it takes long time to make the remaining thickness of the plating layer down to 1.6 μm or less by thermal treatment. In addition, such a long time makes thicker the inter-metal compound diffusion layer composed of copper and tin, thereby deteriorating bendability, which is unfavorable because a crack tends to be introduced into the plating layer. In addition, these plating layers can be formed by electrolytic-plating or non-electrolytic-plating. According to the above configuration of the FPC terminal portion and the FFC terminal portion, even if whiskers develop, the maximum length is less than 50 μm or less, or 30 μm or less, which prevents a short-circuit due to the whiskers when the terminal portion is fitted to the connector. In addition, the terminal portion is free from pin-holes and has a contact resistance of less than 50 mΩ. Its glossiness causes no practical problems. Specifically, when the initial plating thickness is 1.5 μm or more, the terminal portion has excellent glossiness. Furthermore, there is reduced occurrence of cracks due to bending and no adverse effect exerted on a strength of the copper wiring or the like.

A Fourth Embodiment

In an FPC terminal portion or an FFC terminal portion according to a fourth embodiment of the present invention, the aforementioned initial plating thickness can be 0.5 μm or more, under premise that the initial plating layer thickness of the pure tin or tin alloy formed on the copper or the copper alloy wiring is a thickness determined from an amount of tin in the remaining plating layer and the inter-metal compound diffusion layer. When the initial plating layer thickness is determined in this manner, the initial plating layer of products can be known even when it is impossible to measure the plating layer thickness right after the plating is conducted. Namely, the initial plating layer means a layer right after the plating is conducted and thus the diffusion layer is not formed. However, after the thermal treatment, there is formed the diffusion layer composed of an inter-metal compound of copper and tin because of copper diffusion from the underlying layer. As a result, the initial plating layer is thinned. When an amount of tin per a unit area corresponds to that of the initial plating layer of 0.5 μm thick in the tin and the tin alloy layer of the FPC or the FFC terminal portion after thermal treatment, the initial plating layer is considered to be 0.5 μm thick. Therefore, the initial plating layer thickness can be measured. By the way, the amount of tin is measured by measuring a characteristic X-ray intensity using a fluorescent X-ray thicknessmeter, or by dissolving a sample so as to chemically analyze, thereby determining the quantity of tin.

There will be described an experimental result of measurement by such a method. Table 1 shows an experimental condition and result. In this table, a "thickness" of the initial plating layer means a value measured with a fluorescent X-ray thicknessmeter (SFT-3200 of Seiko Instruments Ltd. Co.) within 10 minute after the plating layer has been formed. In the measurement using the fluorescent X-ray thicknessmeter, an amount of tin from an X-ray intensity (eps: counts per second) for tin is obtained, and thus the initial plating thickness is obtained from tin concentration. By the way, the measurement of the fluorescent X-ray intensity was carried out with a collimator of 0.025 mm×0.4 mm.

Additionally, in this measurement, X-ray was radiated in parallel with longitudinal direction of the wiring having a width of 0.4 mm.

TABLE 1

| Example | Type of plating layer (mass %) | Initial plating layer | | | Thermal treatment condition (temp. × time) | X-ray intensity of tin in layer after thermal treatment (cps) | Tin amount (g/m²) | Thickness of the initial plating layer obtained from tin amount (μm) |
|---|---|---|---|---|---|---|---|---|
| | | Thickness (μm) | X-ray intensity of tin | Tin amount (g/m²) | | | | |
| 1 | Sn—1% Cu | 1.48 | 77 | 10.70 | 160° C. × 1 h | 77 | 10.70 | 1.48 |
| 2 | Sn—1% Cu | 1.48 | 77 | 10.70 | 160° C. × 4 h | 77 | 10.70 | 1.48 |
| 3 | Sn—1% Cu | 1.48 | 77 | 10.70 | 250° C. × 30 s | 77 | 10.70 | 1.48 |
| 4 | Sn—1% Cu | 2.69 | 118 | 19.44 | 160° C. × 4 h | 118 | 19.44 | 2.69 |
| 5 | pure Sn | 1.58 | 80 | 11.53 | 160° C. × 4 h | 80 | 11.53 | 1.58 |

Then, the plating layers were thermally treated under various conditions of thermal treatment, thereby forming the inter-metal compound diffusion layer composed of copper and tin. As a result, the remaining plating layers with various thickness were obtained.

As apparent from experimental examples 1 through 5 in Table 1, a thickness of the initial plating before the thermal treatment and a initial plating layer obtained from an amount of tin after the thermal treatment coincide well with each other. Therefore, the thickness of the initial plating layer in the terminal portion can be known at a later time even if the thickness is not measured immediately after plating.

A Fifth Embodiment

In an FPC terminal portion or an FFC terminal portion according to a fifth embodiment of the present invention, a lead-free plating with an excellent solder characteristic or the like can be realized, by selecting a tin alloy among a tin-copper, tin-silver and tin-bismuth alloys. Specifically, it is preferable to select from a tin-copper alloy containing 0.2 to 0.3 mass % of copper, a tin-silver alloy containing 0.5 to 5 mass % of silver, and a tin-bismuth alloy containing 0.5 to 4 mass % of bismuth.

By the way, as for a condition of the thermal treatment on the plating layer composed of the above-mentioned pure tin or tin alloy, the most preferable one can be selected by taking account of a constituting material of an FPC or a type of the plating layer. For example, an industrially practical manufacturing method can be realized by setting a period of several hours at 140 to 180 degrees Centigrade, or a period of a few to a few ten seconds at and around a temperature of a melting point of pure tin or tin alloy. By such a thermal condition, the inter-metal compound diffusion layer containing copper and tin is formed on the aforementioned copper or copper alloy wiring and thereby an FPC terminal portion is obtained in which the remaining thickness of the plating layer of the pure tin or the tin alloy is 0.2 to 1.6 μm or preferably 0.2 μm or more and 1.0 μm or less. Moreover, there is no damage incurred on an insulating material constituting an FPC terminal portion. Furthermore, in the case of an FFC, although a period of 0.05 to a few seconds is practically preferable at a temperature of a melting point or more of the pure tin or the tin alloy, the thermal treatment may be carried out for a longer period of time at a temperature lower than a melting point depending on the circumstances, Otherwise, the treatment may be carried out by a combination of these thermal conditions.

A Six Embodiment

In an FPC terminal portion or an FFC terminal portion according to a fifth embodiment of the present invention, as for the initial plating layer, the initial plating layer of the pure tin or the tin alloy formed on the copper or the copper alloy wiring is formed through one plating operation, which is advantageous in terms of production costs since the aforementioned FPC or FFC terminal portions are obtained through one plating operation. In addition, since it is applicable to not only the pure tin plating but also the lead-free tin alloy plating such as tin-copper, tin-silver, and tin-bismuth alloys, a range of use of plating treatment becomes wide, thereby being useful.

An effect of the present invention has been confirmed by working examples and comparative examples listed in Table 2. In the working examples, first of all, there were prepared FPC terminal portions and FFC terminal portions that had a copper wiring of 0.5 mm pitch. A various type of plating layers shown in Table 2 were formed on them. Next, the FPC terminal portions were thermally treated under a predetermined condition using a conductive annealer or an oven. Then, a cross-section of the plating layer was observed with a SEM (scanning electron microscope) for the inter-metal compound formation and then a thickness of the remaining plating layer was measured. A thickness of the remaining plating layer in Table 2 is an average value of measurement values obtained in 20 points. In addition, a further experiment was carried out by fitting to the terminal portion a ZIF type connector having a pin whose distal end has a curvature of 0.025 mm. As for the connector, two types were used, that is, one was plated with cold/nickel; and the other was plated with pure tin. After the terminal portion and the connecter were fitted to each other, they were left as connected for 1000 hours. Then, the FPC terminal portion or the FFC terminal portion was removed from the ZIF type connector and the plating layer in the terminal portion was observed to check whether whiskers developed or did not. The observation was carried out with an SEM at magnifications of 500 times or more. The results are shown in Table 2. In a "whisker" column Table 2, a double open circle indicates that the maximum length of the whiskers observed is 30 μm or less; an open circle indicates that the maximum length of the whiskers observed is 50 μm or less; and a cross indicates that the maximum length of the whiskers observed is more than 50 μm, Additionally, a contact resistance was measured with a tester after the terminal portion is connected to the ZIF type connector. The results are shown in Table 2. In a "contact resistance" column in Table 2, a cross indicates that a contact resistance is more than 50 mΩ; and an open circle indicates that a contact resistance is less than 50 mΩ. When the contact resistance is less than 50 mΩ, the connection portion excellent in electrical properties can be obtained.

TABLE 2

| | # | Type of plating layer (mass %) | Remain. thickness after thermal treatment (μm) | whisker | contact resistance |
|---|---|---|---|---|---|
| Working example | 1 | Sn—1% Cu | 0.20 | ◎ | ○ |
| | 2 | Sn—1% Cu | 0.23 | ◎ | ○ |
| | 3 | Sn—1% Cu | 0.80 | ◎ | ○ |
| | 4 | Sn—1% Cu | 0.23 | ◎ | ○ |
| | 5 | Sn—1% Cu | 1.60 | ○ | ○ |
| | 6 | Sn—1% Cu | 0.95 | ◎ | ○ |
| | 7 | Sn—1% Cu | 1.04 | ○ | ○ |
| | 8 | Sn—1% Cu | 0.52 | ◎ | ○ |
| | 9 | Sn—2% Ag | 0.45 | ◎ | ○ |
| | 10 | Sn—3% Bi | 0.65 | ◎ | ○ |
| | 11 | Sn—3% Bi | 0.75 | ◎ | ○ |
| | 12 | pure Sn | 1.50 | ○ | ○ |
| | 13 | pure Sn | 0.35 | ◎ | ○ |
| Comparative Example | 1 | Sn—1% Cu | 1.70 | X | ○ |
| | 2 | Sn—1% Cu | 2.80 | X | ○ |
| | 3 | Sn—1% Cu | 0.18 | ◎ | X |
| | 4 | Sn—3% Bi | 0.17 | ◎ | X |
| | 5 | Sn—2% Ag | 0.17 | ◎ | X |

As shown in working examples 1 through 12 in Table 2, whiskers, if any, have a length of 30 μm or less in many cases and the maximum length is 50 μm or less, in an FPC or an FFC terminal portion in which the copper or the copper alloy wiring on which the pure tin or the lead-free tin alloy plating layer was formed was thermally treated, thereby forming an inter-metal compound diffusion layer containing copper or copper alloy was formed on the copper or the copper alloy wiring, and in which a remaining thickness of the pure tin or the tin alloy plating layer was from 0.2 to 1.6 μm. Moreover, when the remaining thickness of the plating layer is 1.0 μm or less, the maximum length of the whisker is 30 μm or less. Additionally, the contact resistance for all the samples is less than 50 μl. Furthermore, a bending characteristic is so favorable that no cracks occur.

In contrast, as shown in comparative examples 1 or 2, when a remaining thickness of the plating layer after thermal treatment is thick, for example, 1.70 μm or 2.80 μm, the maximum length of whiskers developed exceeds 50 μm. In addition, as in comparative examples 3 through 5, when a remaining thickness of the plating layer after thermal treatment becomes less than 0.2 μm, it is not favorable in terms of electrical properties since a contact resistance becomes 50 mΩ.

Next, an effect exerted by the present invention will be confirmed with reference to working examples and comparative examples shown in Table 3. The working examples and the comparative examples listed in Table 3 were manufactured by the same method as those listed in Table 2 previously described. In addition, the same measurement methods were adopted to investigate a contact resistance and existence or absence of whiskers. Additionally, each working (comparative) example was investigated for existence or absence of pin holes after forming the plating layer, with a magnifying glass at a magnification of 100 factors or more. In a "pin hole" column in Table 3, an open circle indicates that no pin holes have been observed; and a cross indicates that at least one pin hole has been observed. In addition, glossiness of the plating surface was measured with a stereoscopic microscope. The result is also shown in Table 3. In a "glossiness" column in Table 3, an open circle indicates that a surface is favorably glossy; and a triangle indicates that a surface is matte even if there is no practical problem.

TABLE 3

| | | Type of plating layer (mass %) | Thick. of plating layer (μm) | | Existence/ absent of pin holes | Whisker | Contact resist. | Glossiness |
|---|---|---|---|---|---|---|---|---|
| | | | Thick. of initial plating layer (μm) | Remaining thick. aft. thermal treat. (μm) | | | | |
| Working Example | 14 | Sn—1% Cu | 0.50 | 0.20 | ○ | ⊚ | ○ | Δ |
| | 15 | Sn—1% Cu | 0.55 | 0.23 | ○ | ⊚ | ○ | Δ |
| | 16 | Sn—1% Cu | 2.80 | 0.80 | ○ | ⊚ | ○ | ○ |
| | 17 | Sn—1% Cu | 1.50 | 0.23 | ○ | ⊚ | ○ | ○ |
| | 18 | Sn—1% Cu | 1.80 | 0.95 | ○ | ⊚ | ○ | ○ |
| | 19 | Sn—1% Cu | 1.30 | 0.52 | ○ | ⊚ | ○ | Δ |
| | 20 | Sn—1% Cu | 2.20 | 1.60 | ○ | ○ | ○ | ○ |
| | 21 | Sn—1% Cu | 2.30 | 1.04 | ○ | ○ | ○ | ○ |
| | 22 | Sn—2% Ag | 0.80 | 0.45 | ○ | ⊚ | ○ | Δ |
| | 23 | Sn—3% Bi | 0.90 | 0.65 | ○ | ⊚ | ○ | Δ |
| | 24 | Sn—3% Bi | 1.80 | 0.75 | ○ | ⊚ | ○ | ○ |
| | 25 | pure Sn | 2.30 | 1.50 | ○ | ○ | ○ | ○ |
| | 26 | pure Sn | 0.80 | 0.35 | ○ | ⊚ | ○ | Δ |
| | 27 | Sn—1% Cu | 4.50 | 1.20 | ○ | ○ | ○ | ○ |
| | 28 | Sn—1% Cu | 4.50 | 0.6 | ○ | ⊚ | ○ | ○ |
| Comp. | 6 | Sn—1% Cu | 0.45 | 0.20 | X | ⊚ | ○ | Δ |
| | 7 | Sn—3% Bi | 0.43 | 0.22 | X | ⊚ | ○ | Δ |
| | 8 | Sn—2% Ag | 0.42 | 0.21 | X | ⊚ | ○ | Δ |

As shown in working examples 14 through 28 in Table 3, whiskers are prevented from developing and even if they develop the maximum length thereof is 50 μm or less, in an FPC or an FFC terminal portion in which the pure tin or the lead-free tin alloy plating layer was formed so as to have the initial plating thickness of 0.5 μm and the copper or the copper alloy wiring was thermally treated, and in which a remaining thickness of the pure tin or the tin alloy plating layer was from 0.2 to 1.6 μm. In addition, when a thickness of the initial plating layer of the pure tin or the lead-free tin alloy is 0.5 μm or more and a remaining thickness of the plating layer is 0.2 μm or more and less than 1.0 μm, the whiskers are further prevented from developing and the maximum length of the whiskers is 30 μm or less. Moreover, a contact resistance is less than 50 mΩ in any working example. Furthermore, when a thickness of the initial plating layer is 0.5 g/m or more, no pin holes are produced and glossiness is excellent. Moreover, no cracks in the plating layer occur in a bending test.

In contrast, as shown in the comparative examples 6 through 8, even if a thickness of the remaining plating layer after thermal treatment is 0.2 μm or more, when the initial layer has a thickness of less than 0.5 μm, the maximum length of whiskers do not exceed 50 μm and a contact resistance is low, but there occurred pin holes. Occurrence of the pin holes is considered to cause an adverse effect for a long period of time in use.

INDUSTRIAL APPLICABILITY

In an FPC terminal portion or an FFC terminal portion in which a tin pure or a tin alloy plating is formed on a copper or a copper alloy wiring as per the present invention, a whisker is so small that no short-circuit occurs even when the portion is used with a connector fitted for a long period of time in use. Therefore, such a portion is useful for various electric apparatuses.

The invention claimed is:

1. A terminal portion having a copper or a copper alloy wiring, to be connect-fitted to a connector by being pressed by a connector pin, of a flexible print circuit board or a flexible flat cable, wherein the copper or the copper alloy wiring having a pure tin or a lead-free tin alloy plating layer formed thereon is thermally treated so as to form an inter-metal compound including copper and tin on the copper or the copper alloy wiring, and a remaining thickness of the pure tin or the lead-free tin alloy plating layer is from 0.2 μm to 1.6 μm, wherein as an initial plating layer, a thickness of the pure tin or the lead-free tin alloy plating layer formed on the copper or the copper alloy wiring is from 1.5 μm to 5.0 μm, and a thickness of the inter-metal compound including copper and tin is from 0.1 μm to 3.5 μm.

2. A terminal portion of a flexible print circuit board or a flexible flat cable as recited in claim 1, wherein the remaining thickness of the pure tin or the lead free tin alloy plating layer is 0.2 μm or more and less than 1.0 μm.

3. A terminal portion of a flexible print circuit board or a flexible flat cable as recited in claim 1 or claim 2, wherein the thickness of the initial plating layer of the pure tin or the lead free tin alloy formed on the copper or the copper alloy wiring is a thickness obtained from an existing amount of tin in the remaining plating layer and the inter-metal compound diffusion layer.

4. A terminal portion of a flexible print circuit board or a flexible flat cable as recited in claim 1 or claim 2, wherein the lead-free tin alloy plating layer is selected from tin-copper alloy, tin-silver alloy, and tin-bismuth alloy.

5. A terminal portion of a flexible print circuit board or a flexible flat cable as recited in claim 1 or claim 2, wherein the initial plating layer of the pure tin or the lead-free tin alloy formed on the copper or the copper alloy wiring is formed through one plating operation.

* * * * *